United States Patent [19]

Isobe et al.

[11] Patent Number: 4,587,638
[45] Date of Patent: May 6, 1986

[54] SEMICONDUCTOR MEMORY DEVICE

[75] Inventors: Mitsuo Isobe, Yokohama; Takayasu Sakurai, Tokyo; Kazuhiro Sawada, Yokohama; Tetsuya Iizuka, Funabashi; Takayuki Ohtani; Akira Aono, both of Tokyo, all of Japan

[73] Assignee: Micro-Computer Engineering Corporation, Japan

[21] Appl. No.: 630,115

[22] Filed: Jul. 12, 1984

[30] Foreign Application Priority Data

Jul. 13, 1983 [JP] Japan ................................ 58-126233
Jul. 15, 1983 [JP] Japan ................................ 58-127770

[51] Int. Cl.⁴ .............................................. G11C 7/02
[52] U.S. Cl. ............................................... 365/200
[58] Field of Search ........................................ 365/200

[56] References Cited

U.S. PATENT DOCUMENTS 3,940,740  2/1976  Coontz ................................ 365/200
4,250,570  2/1981  Tsang et al. ........................ 365/200

OTHER PUBLICATIONS

Electronics—Mar. 13, 1980, pp. 115-121.
Kokkonen et al., "Redundancy Techniques for Fast Static RAMs," IEEE International Solid-State Circuits Conference, ISSCC, pp. 80-81, Feb. 18, 1981.

Primary Examiner—James W. Moffitt
Attorney, Agent, or Firm—Finnegan, Henderson, Farabow, Garrett & Dunner

[57] ABSTRACT

In the semiconductor memory device according to the present invention, when there is a defective portion in the memory cells, those memory cells are replaced by redundant memory cells. When defective portions are discovered in the memory cells, the fuse elements corresponding to the memory cells having the defective portions are cut off. Voltages of the select lines connected to the memory cells having the defective portions are held at an L level by the resistors. Due to this, the memory cells having the defective portions are not selected.

13 Claims, 20 Drawing Figures

SEMICONDUCTOR MEMORY DEVICE

BACKGROUND OF THE INVENTION

The present invention relates to an improvement of a semiconductor memory provided with redundancy circuits.

Recently, high density integration of semiconductor memories has been proposed. Associated with the realization of high density integration is a decrease in manufacturing yield due to a defect in a semiconductor substrate or a defect of a memory cell which is caused in the manufacturing process. To help alleviate the abovementioned situation, a method has been adopted whereby the defective part of the semiconductor memory is replaced by a redundancy circuit formed on the same chip.

FIG. 1 shows a modified form of an arrangement of an RAM provided with redundancy memory cells disclosed on pages 80 and 81 of the Report on the Feb. 18, 1981 Sessions of the ISSCC. In the arrangement of FIG. 1, the redundancy circuits of two rows are formed. Ordinarily, an address signal (eight bits, here) is input from a computer or the like (not shown) to a decoder 1, and the decoder 1 decodes this address signal and outputs it to a selecting circuit 3. The selecting circuit 3 comprises 256 ($=2^8$) NAND gates 31-1 to 31-256 and inverters 33-1 to 33-256 which are respectively connected to the NAND gates 31-1 to 31-256. The selecting circuit 3 receives the decoded address signal and sets a voltage of the select line corresponding to the address signal among select lines 5-1 to 5-256 to the select level (H level, here). The select lines 5-1 to 5-256 are respectively connected to the inverters 33-1 to 33-256. In this way, the memory cells corresponding to the address signal are selected from memory cells 7-1 to 7-256.

Data is read out from or written in the selected memory cells through bit lines 9. At this time, a programmable control circuit 11 outputs a redundancy select signal so as not to select the memory cells for redundancy. FIG. 2 shows an example of the arrangement of the memory cells shown in FIG. 1. This memory cell comprises: n channel MOS transistors 43 and 45 whose gates are connected to a select line 41; a flip flop consisting of n-channel MOS transistors 47 and 49; and resistors 51 and 53. The data is written in and read out from this memory cell through bit lines 55 and 57.

For example, it is assumed that the defective memory cell was found in the memory cells 7-1 and the memory cells 7-1 are substituted by the redundancy memory cells 17-1. The programmable control circuit 11 is programmed so that the redundancy memory cells 17-1 are selected when the address signal designating the memory cells 7-1 is input. This programming is performed by cutting off the fuse elements in the programmable control circuit 11. When the address signal to designate the memory cells 7-1 including the defective memory cell is input, the programmable control circuit 11 outputs an H level redundancy select signals from output terminals A1/A1 to A8/A8 and H level redundancy enable signal from output terminal RE1 to a redundancy selecting circuit 13 in accordance with the programming.

This redundancy selecting circuit 13 is constituted by NAND gates 13-1 and 13-2, which each have 9 input terminals and inverters 13-3 and 13-4, similar to the selecting circuit 3. H level signals are applied to all of the input terminals of the NAND gates 13-1. The redundancy selecting circuit 13 sets a voltage of a select line 15-1 for redundancy to a select level (H level, here) in response to the select signal. Thus, memory cells 17-1 for redundancy are selected.

At the same time, the signal at L level indicating that the redundancy memory cells 17-1 were selected is output from a detecting circuit 21. The detecting circuit 21 comprises a NAND gate 21-1 connected to the output terminals of the NAND gates 13-1 and 13-2 and an inverter 21-2 connected to the output of this NAND gate 21-1. When the redundancy memory cells 17-1 are selected, the NAND gate 13-1 outputs a signal at L level. Due to this, the NAND gate 21-1 outputs a signal at H level. The inverter 21-2 outputs a signal at L level. This L-level signal is input to the NAND gates 31-1 to 31-256.

Therefore, when the redundancy memory cells 17-1 are selected, the NAND gates 31-1 to 31-256 of the selecting circuit 3 output signals at H level. Thus, the inverters 31-1 to 33-256 of the select circuit 3 output signals at the non-select level (L level, here). As a result, the ordinary memory cells 7-1 to 7-256 are not selected irrespective of the value of the address signal. Any of the ordinary memory cells 7-1 to 7-256, if found defective, are substituted by the memory cells 17-1 and 17-2.

In the conventional semiconductor memory device shown in FIG. 1, the detecting circuit 21 detects when the redundancy memory cells 17-1 were selected and outputs the corresponding signal. The selecting circuit 3 receives the output signal of the detecting circuit 21 and sets the ordinary memory cells 7-1 to 7-256 into the non-select state. Namely, voltages of the select lines 5-1 to 5-256 are set to a non-select level (L level, here). Consequently, there is a fear such that both of the redundancy memory cells and ordinary memory cells are selected (double selection). To avoid the abovementioned problem, it is necessary to provide a difference between the time when the voltage of the select line for redundancy is set to H level and the time when the ordinary select line is set to H level. Namely, it is necessary to set the time when the redundancy select line is set to H level later than the time when the select line is set to H level. Due to this, it is difficult to realize the high-speed operation of the semiconductor memory device. In addition, the necessity of the detecting circuit 21 causes the circuit arrangement to become complicated and makes high density integration of the circuit difficult. Further, it is difficult to make the operation of this circuit fast due to the signal delay caused by this detecting circuit 21.

SUMMARY OF THE INVENTION

The present invention was made in consideration of the above-mentioned circumstances and intends to provide a semiconductor memory having redundancy circuits in which the circuit arrangement can be simplified and the operating speed is fast.

The semiconductor memory device according to the present invention comprises:
memory cells for storing data;
a plurality of select lines connected to the memory cells of the respective rows, each of said select lines being commonly connected to the memory cells in the same row;
first selecting means which inputs an address signal and sets a voltage of the select line, corresponding to this address signal among those select lines, into a select level;

memory cells for redundancy;

at least one select line for redundancy which is commonly connected to the memory cells for redundancy arranged on the same row;

programmable redundancy selecting means which inputs the address signal and sets the voltage of the above select line for redundancy into the select level in accordance with the program when the above address signal designates predetermined memory cells; and fuse elements which are individually connected between the selecting means and the each of the select lines.

With such an arrangement, the need for a circuit to detect that the memory cells for redundancy were selected disappears. In addition, there is no need to control the ordinary selecting means by the output signal of such a detecting circuit. Therefore, there is no fear such that both the memory cells and the memory cells for redundancy might be selected (double selection). Further, the arrangement of the selecting means can be simplified and the high-speed operation of the circuit can also be accomplished. Thus, a semiconductor memory with high reliability and high response speed is derived.

DETAILED DESCRIPTION OF THE PREFERRED EMBODIMENT

A semiconductor memory device according to one embodiment of the present invention will now be described below with reference to FIG. 3.

Figure 1:
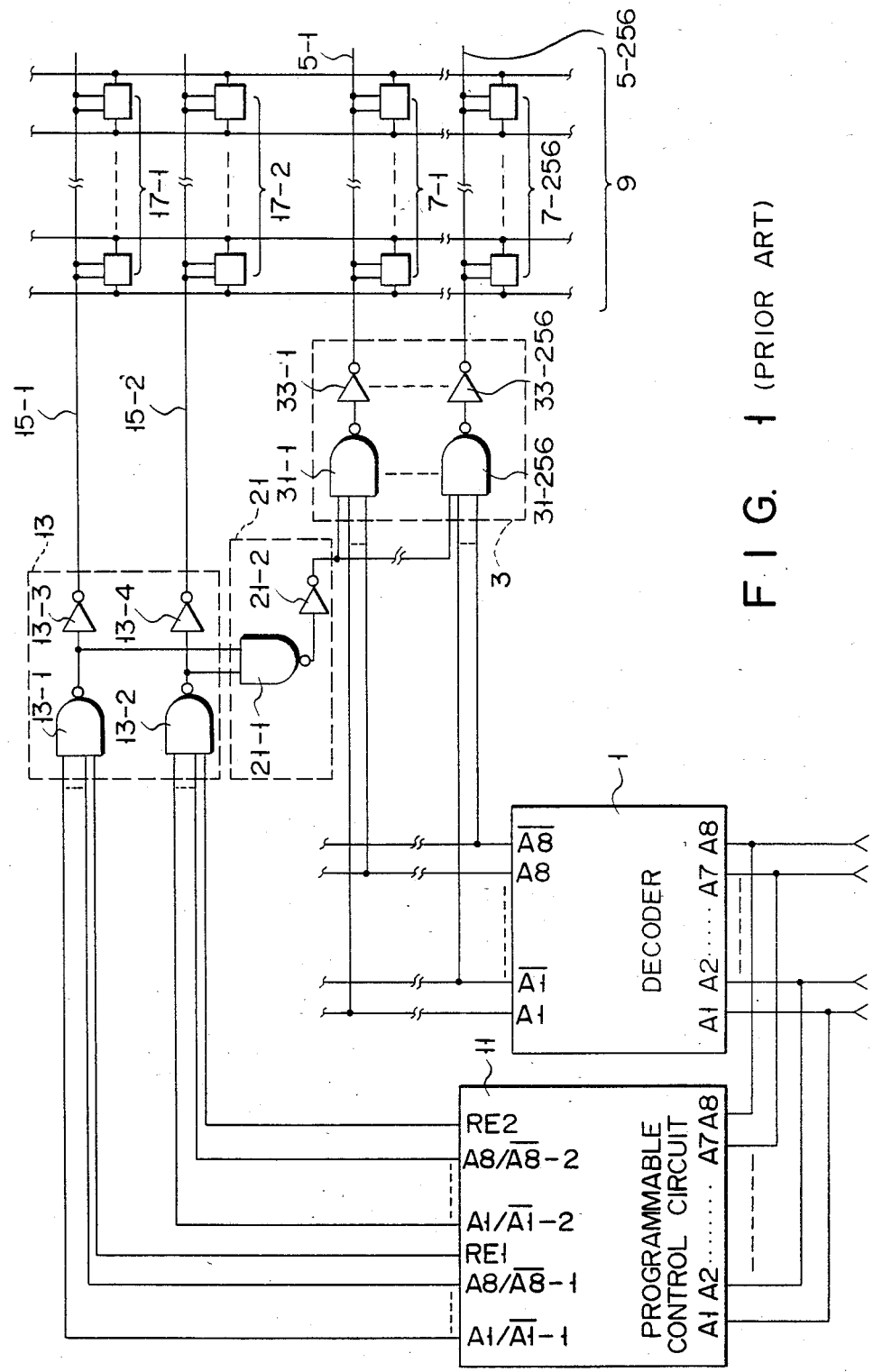
FIG. 1 is a circuit diagram showing one example of the arrangement of the conventional semiconductor memory device.
Figure 2:
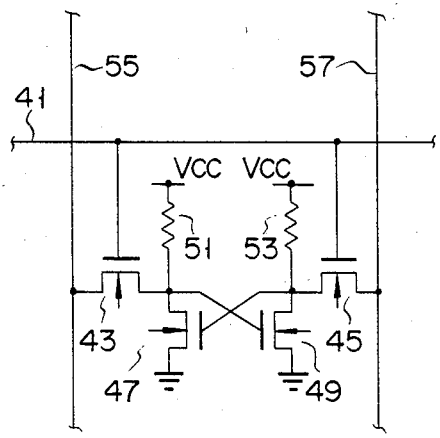
FIG. 2 is a circuit diagram showing one example of the arrangement of the conventional semiconductor memory cell.
Figure 3:
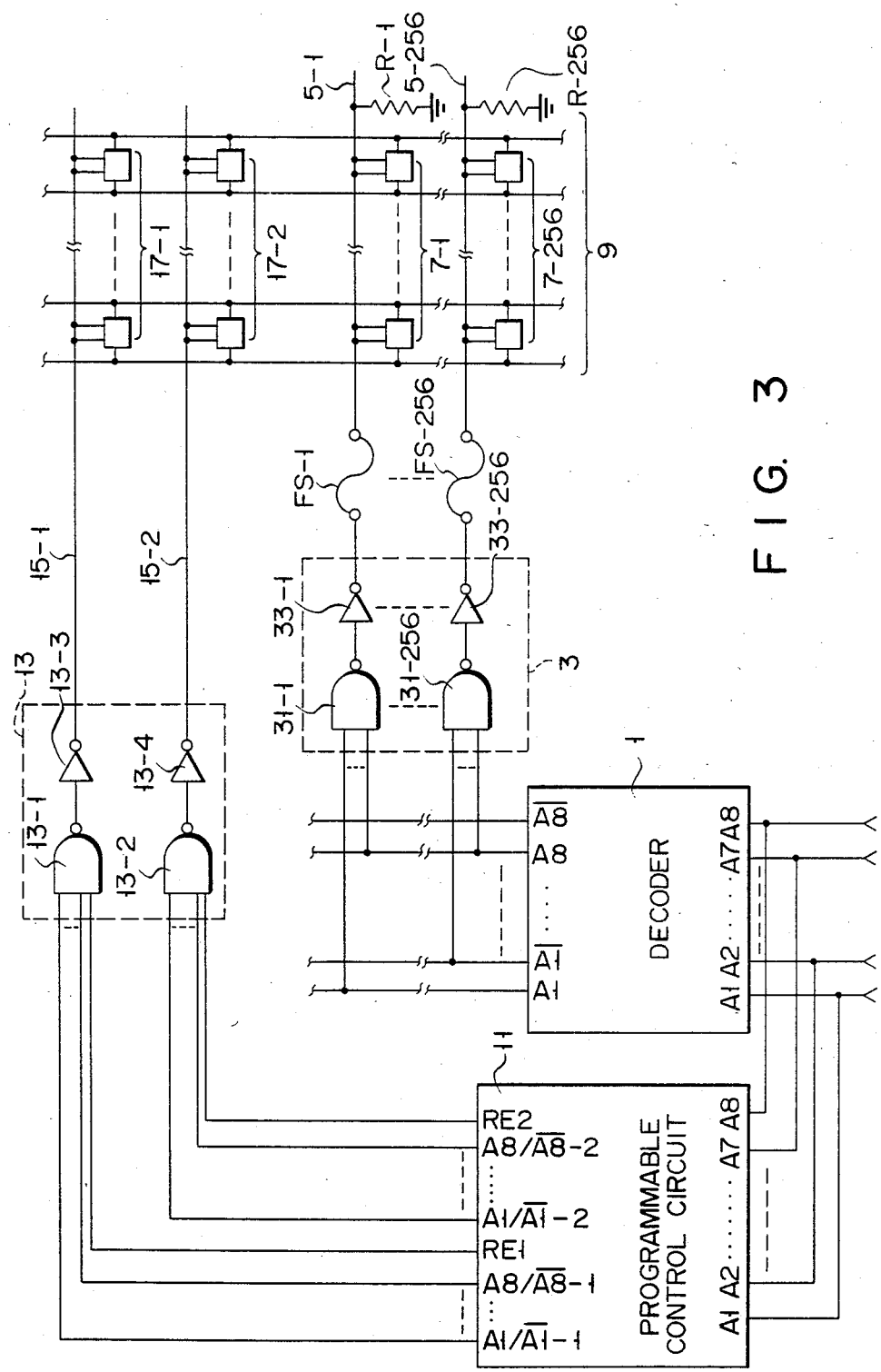
FIG. 3 is a circuit diagram showing the arrangement of the semiconductor memory device according to one embodiment of the present invention.

In FIG. 3, the same parts as those shown in FIG. 1 are designated by the same reference numerals and their descriptions are omitted. Features of the semiconductor memory device shown in FIG. 3 are as follows. (1) The above-mentioned detecting circuit 21 does not exist. (2) Fuse elements FS1 to FS256 are respectively connected between the above-mentioned inverters 33-1 to 33-256 of the selecting circuit 3 and the select lines 5-1 to 5-256. (3) The select lines 5-1 to 5-256 are respectively grounded through loads (resistors) R-1 to R-256.

The operation of the semiconductor memory device shown in FIG. 3 will now be explained. First, the case where there is no failure in the memory cells 7-1 to 7-256 will be described. The address signal is input to the decoder 1. For easy explanation, it is assumed that the address signal designates the memory cells 7-1. The decoder 1 decodes the address signal and outputs the decoded address signal. The signals at H level are input to all of the (nine) input terminals of the NAND gate 31-1 of the selecting circuit 3. This NAND gate 31-1 outputs a signal at L level. On the other hand, at least one signal at L level is input to the input terminals of each of the NAND gates 31-2 to 31-256 of the selecting circuit 3. The NAND gates 31-2 to 31-256 output signals at H level. The inverter 33-1 of the selecting circuit 3 converts the signal output from the NAND gate 31-1 to the signal at H level and outputs it. Due to this, a voltage of the select line 5-1 becomes a select level (H level, here). At this time, the fuse element FS-1 does not exert an electrical influence upon the circuit. The other inverters 33-2 to 33-256 of the selecting circuit 3 output signals at L level. Thus, the voltages of the select lines 5-2 to 5-256 become non-select level (L level, here).

The programmable control circuit 11 inputs the address signal and outputs the select signal in accordance with the program. Namely, the programmable control circuit 11 outputs a redundancy select signals and redundancy enable signals so as not to select the memories 17-1 and 17-2 for redundancy. Therefore, the signal at L level is input to at least one of the input terminals of the NAND gate 13-1 of the redundancy selecting circuit 13. Similarly, the signal at L level is input to at least one of the input terminals of the NAND gate 13-2. Due to this, the NAND gates 13-1 and 13-2 output the signals at H level. The inverters 13-3 and 13-4 invert these H-level signals and output the signals at L level. As a result, the voltages of the redundancy select lines 15-1 and 15-2 become L level. As described above, the memory cells 7-1 responsive to the address signal are selected. Data is read out from and written in the memory cells 7-1 selected through the bit lines 9.

Next, the case where there is a defective portion in the memory cells 7-1 to 7-256 will be explained.

For explanation, in this embodiment, the case where the memory cells 7-1 having the defective portion are substituted by the redundancy memory cells 17-1 will be discussed.

In the case where the presence of the defective portion in the memory cells 7-1 was discovered, the fuse element FS-1 is cut. This cutting of the fuse element FS-1 is done by radiating, for instance, a laser beam to this fuse element FS-1. The fuse element FS-1 is fused due to the irradiation of the laser beam. Then, the programmable control circuit 11 is programmed. This programming is performed so that the redundancy memory cells 17-1 are selected when the address signal designates the defective memory cells 7-1. This programming can be implemented in the conventional manner.

As mentioned before, when the address signal which designates the memory cells 7-1 is input to the decoder 1, the converter 33-1 of the selecting signal 3 outputs the signal at H level. Since the fuse element FS-1 has been cut off, this H-level signal is not transmitted to the select line 5-1. The voltage of the select line 5-1 becomes the ground voltage (non-select level) due to the resistor R-1. Thus, the memory cells 7-1 are not selected (become the non-select state). The programmable control circuit 11 outputs the H level redundancy select signals from output terminals A1/A1 to A8/A8 and H level redundancy enable signal from output terminals RE1 in accordance with the programming. Therefore, when the address signal designates the memory cells 7-1, the H level signals are input to all of the 9 input terminals of the NAND gate 13-1 of the redundancy selecting circuit 13. Thus, the NAND gate 13-1 outputs the L-level signal, while the inverter 13-3 outputs the H-level signal. The voltage of the redundancy select line 15-1 becomes H level (select level) and the redundancy memory cells 17-1 are selected. Data is read out from and written in these memory cells 17-1 selected through the bit lines 9. In this way, the memory cells 7-1 having the defective portion can be substituted by the memory cells 17-1 for redundancy.

As described above, according to the present invention, the memory cells 7-1 having the defective portion are substituted by the redundancy memory cells 17-1 by cutting off the fuse element FS-1. Therefore, the circuit 21 for detecting that the redundancy memory cells 17-1 were selected as in the conventional device is unnecessary. Thus, the circuit arrangement is simplified and the high-speed operation of this memory device can be further realized. In addition, there is no fear such that both memory cells 7-1 and 17-1 are double-selected. Further, when the fuse elements FS-1 to FS-256 are cut off, the resistors R-1 to R-256 serve to securely hold the voltages of the select lines 5-1 to 5-256 at the ground level. As a result, the memory cells 7-1 having the defective portions are securely set into the non-select state.

Also, in the foregoing embodiment, the case where the memory cells 7-1 are substituted by the redundancy memory cells 17-1 has been described. However, it is not limited to this. It is possible to arbitrarily substitute memory cells 7-1 to 7-256 for redundancy memory cells 17-1, 17-2 in accordance with the cutting of the fuse elements FS-1 to FS-256 and with the programming of the programmable control circuit 11.

Figure 4:
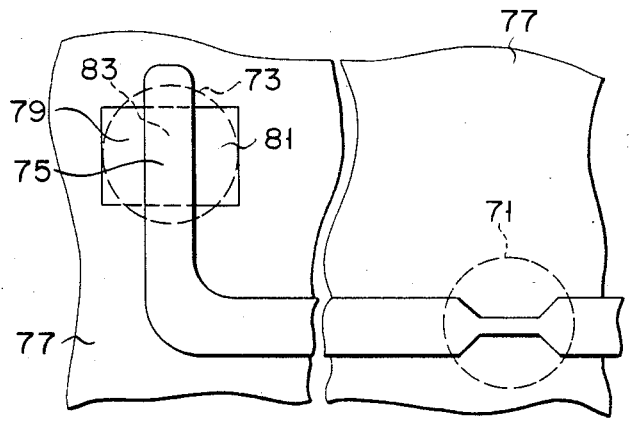
FIGS. 4 and 5 are plan views to explain the fuse element according to embodiments of the present invention.

One example of the arrangement of the fuse elements FS-1 to FS-256 is shown in FIG. 4. In FIG. 4, a fuse element 71 is formed integrally with a gate electrode 75 of an MOS transistor 73. The transistor 73 constitutes a part of the circuit shown in FIG. 3. The transistor 73 is formed by a source 79, a drain 81 and a gate 83 formed in the semiconductor substrate.

In this way, the fuse elements FS-1 to FS-256 are formed by the same process as the process to form the gate electrode of the transistor which constitutes the circuit of the semiconductor memory device shown in, e.g., FIG. 3. The fuse elements FS-1 to FS-256 are made of the same material as the gate electrode, for instance, polycrystalline silicon or molybdenum silicide.

Figure 5:
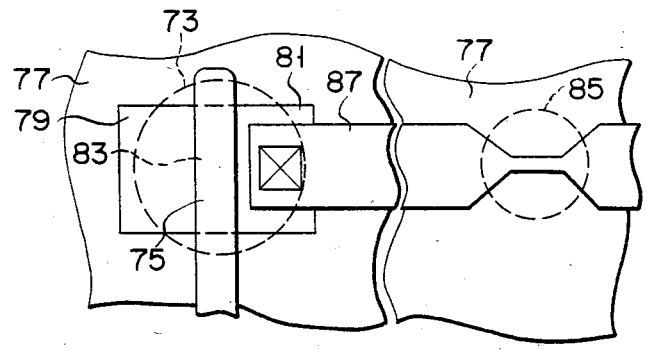

FIG. 5 shows another embodiment of the arrangement of the fuse elements FS-1 to FS-256. In FIG. 5, a fuse element 85 is constituted integrally with a wiring 87 of the drain 81. In this way, the fuse elements FS-1 to FS-256 may be formed by the same process as the process of forming the wirings. In addition, the material thereof may be the same as the wiring material such as polycrystalline silicon, aluminum, molybdenum silicide, etc. In FIGS. 4 and 5, only the portions necessary for explanation are set forth for simplicity, and an oxide film and other transistors, for instance, are omitted.

In the embodiment of FIG. 3, the resistors R-1 to R-256 were connected as the loads between the respective select lines 5-1 to 5-256 and the ground. This is to prevent the voltages of the select lines 5-1 to 5-256 from entering the floating state when the fuse elements FS-1 to FS-256 are cut off. When the voltage of the select line 5-1 assumes the floating state, the voltage of the above-mentioned select line is easily varied due to the influence of the noise by the circumferential signal lines. In addition, in some cases, there is a fear that the memory cells 7-1 having the defective portion may change from the "non-select state" to the "select state". Due to this, there is a fear that the data of the selected redundancy memory cells collide with the data of the memory cells having the defective portion on the data line. Namely, there is fear that this semiconductor memory device will malfunction. However, in the above-described embodiment, when the fuse elements FS-1 to FS-256 are cut off, the loads (resistors R-1 to R-256) securely hold the voltages of the select lines 5-1 to 5-256 at ground level. Due to this, the memory cells 7-1 having the defective portion assume the non-select state. However, this invention is not limited to this. If the voltages of the select lines 5-1 to 5-256 are held at the ground level, without assuming the floating state, in the state whereby the fuse elements FS-1 to FS-256 have been cut off, there is no need to use the resistors R-1 to R-256.

Figure 6:
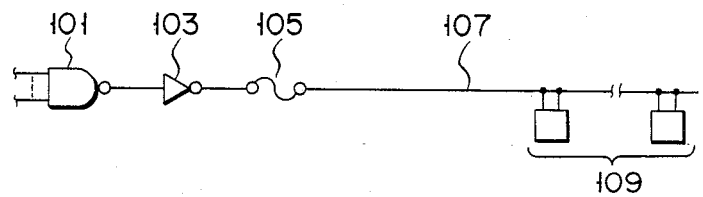
FIGS. 6 to 20 are circuit diagrams to explain the arrangements of the semiconductor memory devices according to other embodiments of the present invention.

FIG. 6 shows the embodiment in the case where the above-mentioned loads are not connected. In addition, in the following description, only the main part of that circuit will be explained. A fuse element 105 is connected to the selecting circuit constituted by a NAND gate 101 and an inverter 103. A select line 107 is connected to the fuse element 105. Memory cells 109 are connected to the select line 107.

Figure 7:
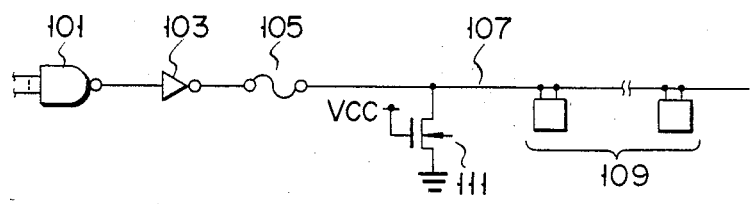

FIG. 7 shows another embodiment of the semiconductor memory device shown in FIG. 3.

A feature of the circuit shown in FIG. 7 is that an n channel MOS transistor 111 is connected as a load in place of the resistors R-1 to R-256. A predetermined voltage Vcc is applied to the gate of the transistor 111. This transistor 111 is, therefore, ordinarily in the ON state. Due to this, in the state whereby the fuse element 105 has been cut off, the voltage of the select line 107 is certainly held at the ground level by the transistor 111.

Figure 8:
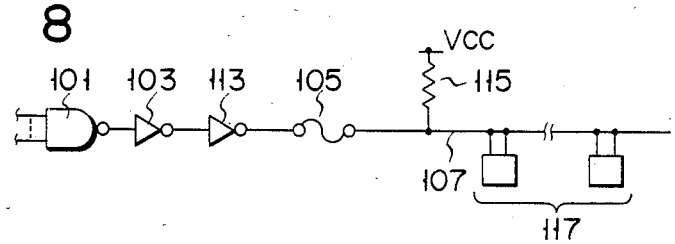

In the above embodiment, the case wherein memory cells were used which assume the select state when the voltage of the select line is at the H level has been described. However, this invention is not limited to this. For example, where memory cells are constituted by the p channel MOS transistors, the invention can be also applied to the case where memory cells are used which assume the select state when the voltage of the select line is at the L level. FIG. 8 shows a circuit diagram according to such an embodiment.

A feature of the circuit shown in FIG. 8 is that an inverter 113 is provided between the inverter 103 and the fuse element 105. Further, one end of a resistor 115 is connected to the select line 107 and a predetermined voltage Vcc is applied to the other end of the resistor 115. Also, the memory cells connected to the select line 107 become the select state when the voltage of the select line 107 is at the L level. In the case where the address signal designates memory cells 117, the inverter 113 outputs the signal at the L level. When the fuse element 105 has been cut, the resistor 115 surely holds the voltage of the select line 107 to the voltage Vcc. Therefore, memory cells 117 do not assume the select state.

Figure 9:
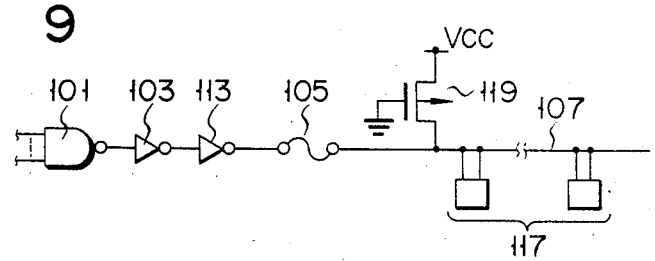

FIG. 9 shows an example of the applied form of the circuit shown in FIG. 8. A feature of this circuit is that a p channel MOS transistor 119 which is ordinarily in the ON state is used in place of the resistor 115. One end of the current line of this p channel MOS transistor 119 is connected to the select line 107, while a predetermined voltage Vcc is applied to the other end. Further, the ground voltage is applied to the gate thereof. Even in the circuit of FIG. 9, when the fuse element 105 has been cut off, the voltage of the select line 107 is certainly held at the H level. Thus, the memory cells 117 do not assume the select state.

Figure 10:
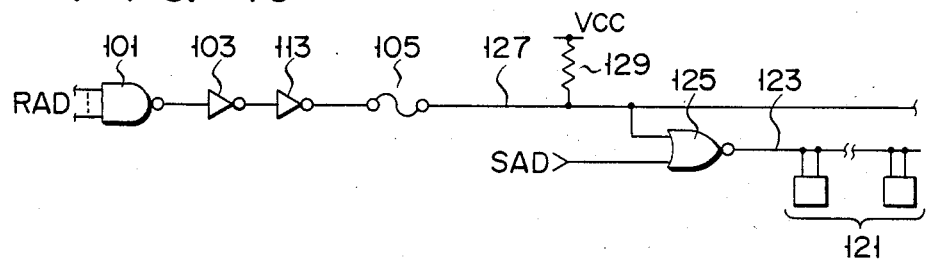

FIG. 10 shows an embodiment in which this invention was applied to the device wherein double select lines are used. In FIG. 10, memory cells arranged on the same row are divided into several sections by the boundary lines extending in the column direction. The memory cells which belong to the same section are connected to a first select line provided in each section. For example, memory cells 121 in the same section are connected to a first select line 123. This first select line 123 is connected to an output terminal of a NOR gate 125. One input terminal of this NOR gate 125 is connected to a second select line 127. This second select line is provided in each "row". It is assumed that the memory cells 121 assume the "select state" when the first select line 123 is at the H level. The fuse element 105 is connected between the second select line 127 and the inverter 113. Also, one end of a resistor 129 is connected to the second select line 127. A voltage Vcc is applied to the other end of the resistor 129. When the address signal designates the memory cells 121, a decoder (not shown) outputs a signal RAD to designate "row" to the NAND gate 101. Further, the decoder outputs a signal SAD to designate "section" to the other input terminal of the NOR gate 125. In the circuit of FIG. 10, when the fuse element 105 has been cut off, the voltage of the second select line 127 is held at the H level by the resistor 129. Thus, the NOR gate 125 outputs the signal at the L level. Therefore, the memory cells 121 are not selected (assume the non-select state).

Figure 11:
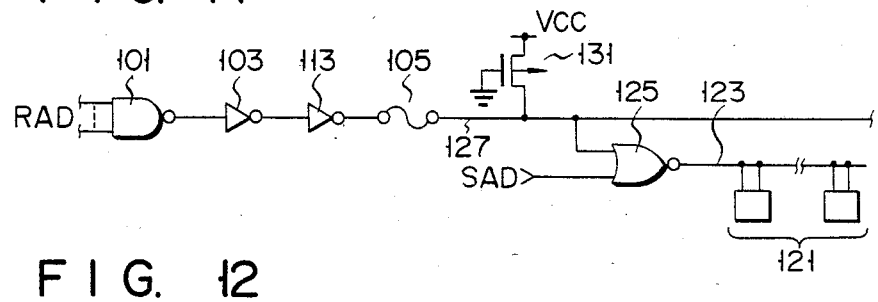

FIG. 11 shows another embodiment of FIG. 10. In FIG. 11, a transistor 131 which is ordinarily in the ON state is connected in place of the resistor 129. Even in the circuit shown in FIG. 11, when the fuse element 105 is cut off, the transistor 131 securely holds the voltage of the 2nd select line 127 at the H level. Thus, the memory cells 121 do not assume the select state similar to the circuit shown in FIG. 10.

Figure 12:
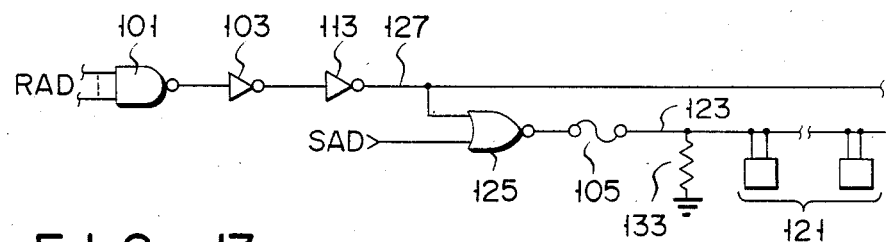

FIG. 12 shows an embodiment in the case where the fuse element 105 is provided in each "section." In FIG. 12, the fuse element 105 is connected between the first select line 123 and the NOR gate 125. Further, the first select line 123 is grounded through a resistor 133. Thus, when the fuse element 105 has been cut off, the voltage of the first select line 123 is securely held at the ground level.

Figure 13:
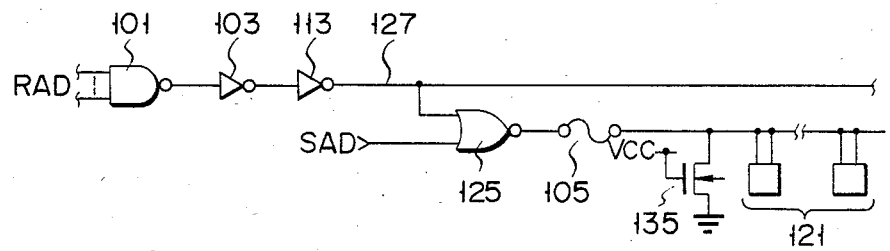

FIG. 13 shows another embodiment of the circuit shown in FIG. 12. In the circuit shown in FIG. 13, the first select line is grounded through a transistor 135 which is ordinarily in the ON state.

In the embodiments shown in FIGS. 7 to 13, it is necessary that the value of the load (resistor or transistor) satisfies the following conditions. (1) It is a high resistance of the order so as not to exert an influence upon the operations of the memory devices or the operation to select the memory devices. (2) It has a value such that when the fuse element 105 is cut off, the select line can be set securely into the non-select level a short time after the power is on.

For example, the value of the resistor 129 of FIG. 10 is about a few k ohms. And in the case where a CMOS device is used in the circumferential circuit of the load, the value of the load is desirably within a few G ohms to hundreds of G ohms due to the limitation of the standby current of the CMOS device.

Figure 14:
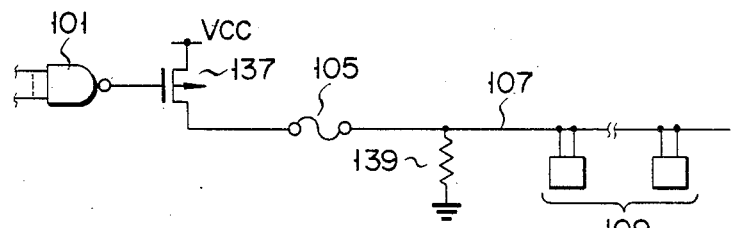

FIG. 14 shows an example of the applied form of the circuit shown in FIG. 3. In FIG. 14, an output terminal of the NAND gate 101 is connected to a gate of a p channel MOS transistor 137. The voltage Vcc is applied to a source of this MOS transistor 137. and that transistor's drain is connected to one end of the fuse element 105. The other end of the fuse element 105 is connected to the select line 107. The select line 107 is grounded through a resistor 139.

In FIG. 14, when the fuse element 105 is not cut off, the p channel MOS transistor 137 and resistor 139 cooperatively operate as the inverter, thereby driving the voltage of the select line 107. In addition, the transistor 137 operates as the driver and the resistor 139 operates as the load. On one hand, when the fuse element 105 has been cut off, the resistor 139 holds the voltage of the select line 107 at the ground level. So the memory cells 109 are not selected.

Figure 15:
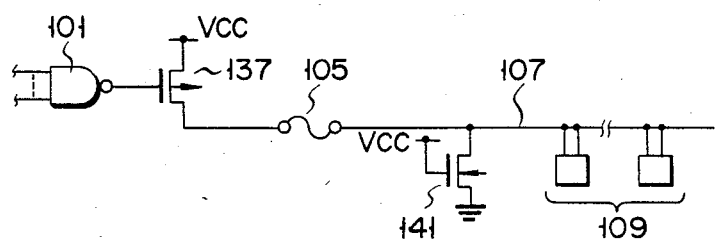

FIG. 15 shows an example of the applied form of the circuit shown in FIG. 14 and corresponds to FIG. 7. A feature of the circuit shown in FIG. 15 is that an n channel MOS transistor 141 is connected in place of the resistor 139. When the fuse element 105 is not cut off, the MOS transistors 137 and 141 cooperatively operate as the inverter. When the fuse element 105 has been cut off, the MOS transistor 141 holds the voltage of the select line 107 at the ground voltage. Thus, the memory cells 109 are not selected.

Figure 16:
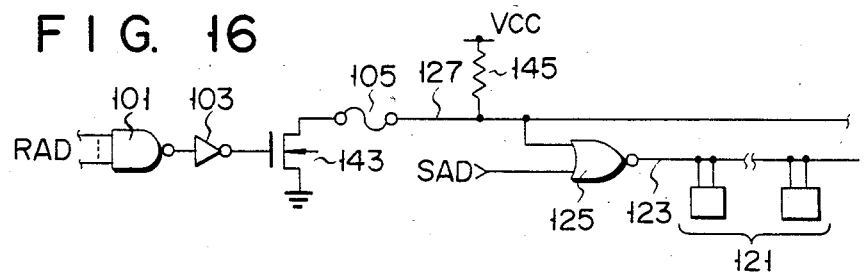

Similarly, FIG. 16 shows an example of the applied form of the circuit shown in FIG. 10. In the circuit shown in FIG. 16, the output terminal of the inverter 103 is connected to a gate of an n channel MOS transistor 143. A source of this transistor 143 is grounded. A drain of this transistor 143 is connected to the fuse element 105. Also, one end of a resistor 145 is connected to the second select line 127. The predetermined voltage Vcc is applied to the other end of the resistor 145. In the circuit shown in FIG. 16, when the fuse element 105 is not cut off, the MOS transistor 143 and resistor 145 cooperatively operate as the inverter, thereby driving the voltage of the second select line 127. On the other hand, when the fuse element 105 has been cut off, the resistor 145 holds the voltage of the second select line 127 at an H level. Thus, the memory cells 121 are not selected.

Figure 17:
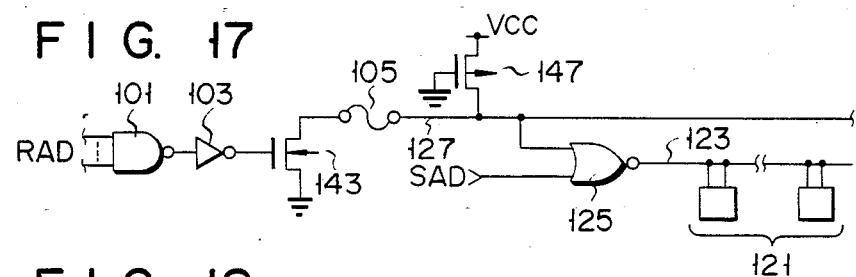

FIG. 17 shows an example of the applied form of the circuit shown in FIG. 16 and corresponds to the circuit shown in FIG. 11. A feature of the circuit shown in FIG. 17 is that a transistor 147 which is ordinarily in the ON state is used in place of the resistor 145. When the fuse element 105 is not cut off, the MOS transistors 143 and 147 operate as the inverter. On the other hand, when the fuse element 105 has been cut off, the p channel MOS transistor 147 holds the voltage of the second select line 127 at an H level. Thus, the memory cells 121 are not selected.

Figure 18:
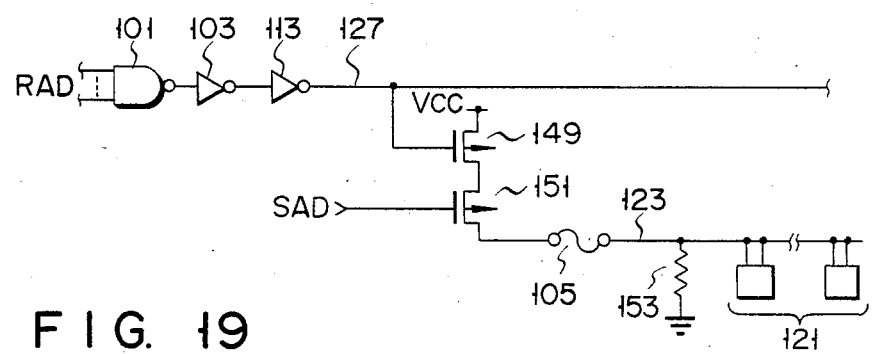

FIG. 18 shows an example of the applied form of the circuit shown in FIG. 12. A feature of the circuit shown in FIG. 18 is that p channel MOS transistors 149 and 151 which are connected in series are used in place of the NOR gate 125. The second select line 127 is connected to a gate of the p channel MOS transistor 149. The voltage Vcc is applied to a source of the transistor 149. A drain of the transistor 149 is connected to a source of the transistor 151. A drain of the transistor 151 is connected to the fuse element 105. In addition, the above-mentioned signal SAD is input to a gate of the transistor 151. The first select line 123 is grounded through a resistor 153. In FIG. 18, when the fuse element 105 is not cut off, the transistors 149 and 151 and the resistor 153 cooperately operate as the NOR gate, thereby driving the voltage of the first select line 123. When the fuse element 105 has been cut off, the resistor 153 holds the voltage of the first select line 123 at the ground level.

Figure 19:
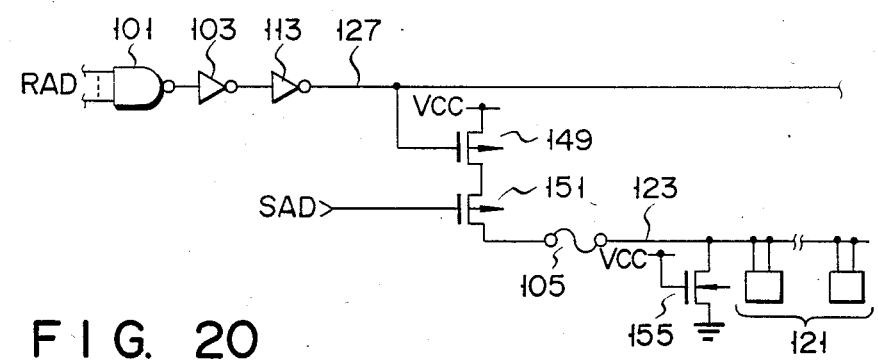

FIG. 19 shows an example of the applied form of FIG. 18 and corresponds to the circuit shown in FIG. 13. A feature of the circuit shown in FIG. 19 is that an n channel MOS transistor 155 is used in place of the resistor 153. In the circuit shown in FIG. 19, when the fuse element 105 is not cut off, the MOS transistors 149, 151 and 155 operate as the NOR gate. When the fuse element 105 has been cut off, the transistor 155 holds the voltage of the first select line 123 at the ground level.

In the circuits shown in FIGS. 14 to 19, it is necessary that the characteristics of the loads (resistors 141, 145, 153 or transistors 141, 147, 155) or the driving transistors 137, 143, 149, and 151 satisfy the following conditions: (1) The loads or driving transistors are combined and can operate as the inverter or NOR circuit, and (2) When the fuse element 105 has been cut off, the load can hold the voltage of the select line at the non-select level. Therefore, the load is not necessarily a high resistance.

In the circuits shown in FIGS. 14 to 19, the loads which are not high resistances are used. Thus, when the fuse element 105 has been cut off, the voltage of the select line 107 (first select line 123, second select line 127) reaches the "non-select level" faster. In addition, since the construction of the circuit to drive the voltage of the select line is simplified, the capacitance is decreased and the access time becomes short. Also, since the number of transistors is reduced, high density integration can be realized.

Figure 20:
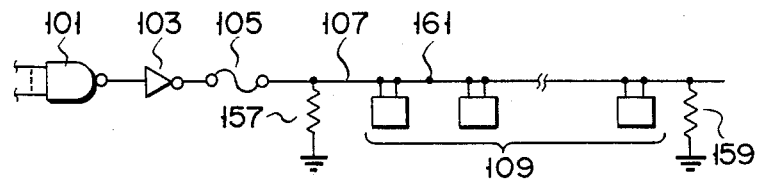

FIG. 20 shows another embodiment of the present invention. A feature of the circuit shown in FIG. 20 is that a plurality of resistors 157 and 159 are connected as loads. It is assumed that the select line 107 was cut at a point 161. Now, assuming that the resistor 157 does not exist, there is a possibility that the portion subsequent to the point 161 of the select line 107 will assume the floating state. However, since a plurality of resistors 157 and 159 are provided, the voltage of the select line 107 is assuredly held at an L level. In addition, similarly, even in the circuits shown in FIGS. 3 to 19, it is also possible to use as loads a plurality of resistors or a plurality of transistors which are ordinarily in the ON state. In the circuits shown in FIGS. 10 to 20, the case where use of the memory cells which assume the select state when the voltage of the select line is at an H level has been described. However, the invention is not limited to this. For instance, similar to the cases shown in FIGS. 8 and 9, the invention can be applied even in the case where the memory cells are used which assume the select state when the select line is at L level.

What is claimed is:

1. A semiconductor memory device comprising:
   memory cells, arranged in rows, for storing data;
   a plurality of select lines, each of which is connected to the memory cells in a different one of said rows;
   first selecting means for receiving an address signal and for setting a predetermined voltage on one of said plurality of select lines corresponding to the contents of said address signal, thereby to place said one select line at a select level;
   redundant memory cells arranged in rows;
   at least one redundancy select line which is commonly connected to said redundant memory cells arranged in the same row;
   programmable redundancy selecting means for receiving said address signal and for placing said redundancy select line at a select level designated by said address signal;
   cuttable fuse elements individually connected between said first selecting means and a different one of said select lines; and
   load means connected between said select lines and a predetermined voltage for maintaining the voltage on a select line at a non-select level different from said select level if said corresponding select line fuse element is cut.

2. A semiconductor memory device according to claim 1, wherein said first selecting means comprises:
   select signal generating means for inputting said address signal and outputting a select signal corresponding to said address signal; and
   a transistor circuit connected to said select signal generating means and to each of said fuse elements, said transistor circuit being combined with said load means and operating as an inverter circuit when said fuse elements are not cut off.

3. A semiconductor memory device according to claim 1, wherein said load means includes resistor elements.

4. A semiconductor memory device according to claim 1, wherein said load means includes MOS transistors.

5. A semiconductor memory device according to claim 1, wherein said load means includes a plurality of elements connected at several locations on said select lines.

6. A semiconductor memory device according to claim 1, wherein each of said rows of memory cells is divided into a plurality of sections, and
   wherein said select lines include first select lines provided in each of said sections and being connected to said first selecting means, each of said first select lines being commonly connected to said memory cells in the same section; and second select lines which are provided for every one of said rows and are connected to said first selecting means, said fuse elements being individually connected between said first selecting means and each of said first select lines.

7. A semiconductor memory device according to claim 6, wherein said load means includes resistor elements.

8. A semiconductor memory device according to claim 6, wherein said load means includes MOS transistors.

9. A semiconductor memory device according to claim 6, wherein said first selecting means comprises:
   select signal generating means for inputting said address signal and outputting a select signal corresponding to said address signal; and
   a transistor circuit connected to said select signal generating means and said fuse elements, said transistor circuit being combined with said load means and operating as an inverter circuit when said fuse elements are not cut off.

10. A semiconductor memory device according to claim 1, wherein each of said rows of memory cells is divided into a plurality of sections, and
    wherein said select lines include first select lines provided in each of said sections and connected to said first selecting means, each of said first select lines being commonly connected to said memory cells in the same section; second select lines which are provided for every one of said rows and are connected to said first selecting means, said fuse elements being individually connected between said selecting means and each of said second select lines and said load means being connected to said second select lines.

11. A semiconductor memory device according to claim 10, wherein said load means includes resistor elements.

12. A semiconductor memory device according to claim 10, wherein said load means includes MOS transistors.

13. A semiconductor memory device according to claim 10, wherein said first selecting means comprises:
select signal generating means for inputting said address signal and outputting a select signal corresponding to said address signal; and
a transistor circuit connected to said select signal generating means, each of said select lines and each of said fuse elements, said transistor circuit being combined with said load means and operating as a NOR gate circuit when said fuse elements are not cut off.

* * * * *